United States Patent [19]
Yamakawa et al.

[11] Patent Number: 5,370,907
[45] Date of Patent: Dec. 6, 1994

[54] FORMING A METALLIZED LAYER ON AN ALN SUBSTRATE BY APPLYING AND HEATING A PASTE OF A METAL COMPOSED OF W AND MO

[75] Inventors: Akira Yamakawa; Nobuo Ogasa, both of Hyogo, Japan

[73] Assignee: Sumitomo Electric Industries, Ltd., Osaka, Japan

[21] Appl. No.: 147,820

[22] Filed: Nov. 2, 1993

Related U.S. Application Data

[63] Continuation-in-part of Ser. No. 975,125, Nov. 12, 1992, abandoned, which is a continuation of Ser. No. 713,803, Jun. 12, 1991, abandoned.

[30] Foreign Application Priority Data

Jun. 15, 1990 [JP] Japan ................... 2-158145

[51] Int. Cl.$^5$ ............................... B05D 3/02
[52] U.S. Cl. .................. 427/376.3; 427/383.5; 427/397.7
[58] Field of Search ........... 427/376.3, 383.5, 383.6, 427/397.7

[56] References Cited

U.S. PATENT DOCUMENTS

| | | | |
|---|---|---|---|
| 4,695,517 | 9/1987 | Okuno et al. | 428/698 |
| 4,770,953 | 9/1988 | Horiguchi et al. | 428/698 |
| 4,840,853 | 6/1989 | Iio et al. | 428/698 |
| 4,965,659 | 10/1990 | Sasamew et al. | 357/81 |

FOREIGN PATENT DOCUMENTS

| | | | |
|---|---|---|---|
| 58-11390 | 3/1983 | Japan | C04B 39/00 |
| 63-115393 | 5/1988 | Japan | H05K 1/09 |

OTHER PUBLICATIONS

Patent Abstracts of Japan No. 1-83586 (A); Kyocera Corp. Mar. 29, 1989.
Patent Abstracts of Japan No. 1-833587 (A); Kyocera Corp. Mar. 29, 1989.
Patent Abstracts of Japan No. 1-249681 (A); Sumitomo Electric Industries, Ltd. Apr. 10, 1989.

*Primary Examiner*—Shrive Beck
*Assistant Examiner*—Benjamin L. Utech
*Attorney, Agent, or Firm*—W. G. Fasse; W. F. Fasse

[57] ABSTRACT

A metallized layer is to be formed on a surface of an aluminum nitride base material, which may be a sintered body or a nonsintered compact. A mixture is prepared from an oxide component consisting of at least one of $Al_2O_3$, $SiO_2$, CaO, and $Y_2O_3$, an iron family component consisting of at least one of Fe, Co and Ni and high melting temperature metal consisting of W and Mo. The content of each component is within a specified range. A paste is prepared by adding an organic binder substance to the mixture. The paste is applied to the surface of the base material and heated under specified conditions to form a metallized layer having a high adhesive peel strength on the surface of the base material.

10 Claims, 2 Drawing Sheets

FORMING A METALLIZED LAYER ON AN ALN SUBSTRATE BY APPLYING AND HEATING A PASTE OF A METAL COMPOSED OF W AND MO

CROSS-REFERENCE TO RELATED APPLICATION

The present application is a Continuation-In-Part Application of our commonly assigned U.S. patent application Ser. No. 07/975,125, filed on Nov. 12, 1992 and now abandoned, which is a File Wrapper Continuation Application of U.S. patent application Ser. No.: 07/713,803, filed on Jun. 12, 1991, and abandoned.

FIELD OF THE INVENTION

The present invention relates to a method of forming a metallized layer on a surface of an aluminum nitride base material. More particularly, the metallized layer is formed to contain a high melting temperature metal as a metal component. The invention further relates to such a metallized layer.

BACKGROUND INFORMATION

In recent years, semiconductor devices have been highly integrated and have achieved increased operating speeds. The degree of integration has been greatly improved particularly by LSI and VLSI technologies, for example. Thus, the heat radiation property of a substrate for carrying a semiconductor device has become ever more important.

A ceramic material used as a substrate for such ICs has generally been made from alumina ($Al_2O_3$). However, a conventional alumina sintered body has a low thermal conductivity and an insufficient heat radiation property. Thus, it is difficult to use an alumina sintered body as a substrate capable of sufficiently conducting and dissipating the increased heat generated by ever more integrated IC chips.

In place of such an alumina substrate, attention has recently been directed to a substrate or a heat sink made of aluminum nitride having high thermal conductivity.

Aluminum nitride is a material essentially having a high thermal conductivity and high electrical insulability, with no toxicity, unlike beryllium, which also has high thermal conductivity. Thus, aluminum nitride provides an excellent electrical insulating material or a package material for a semiconductor device. However, an aluminum nitride sintered body having the aforementioned characteristics has a poor junction strength between the aluminum nitride and a metal or vitreous material coating on the surface of the aluminum nitride. The coating forming a metallized layer may be applied by several methods such as a thick film forming method of directly applying commercially available metallized paste onto the surface of the aluminum nitride sintered body, or by a thin film method of forming a thin film of an active metal or by a technique such as vapor deposition for forming a metal film. However, these known methods do not provide a sufficient junction strength between the aluminum nitride sintered body and the coating film. In practice, therefore, it is necessary, for example, to reform or treat the surface of the aluminum nitride sintered body by some technique before or during the metallization step, in order to improve the junction strength of a metal coating on the AlN sintered body.

In a well-known conventional method for such reforming, an oxide layer is formed by oxidizing a surface of an aluminum nitride sintered body.

For example, Japanese Patent Publication No. 58-11390 (1983) discloses a method of forming an oxide layer of $SiO_2$, $Al_2O_3$, mullite, $Fe_2O_3$ and the like on a surface of an aluminum nitride sintered body. However, while such an oxide layer has an excellent affinity to a glass layer, it is believed that it has a poor or low affinity to an aluminum nitride sintered body, which is disadvantageous because the junction strength is not reliable. More specifically, an unreliable junction strength between the oxide layer and the aluminum nitride sintered body involves no dispersion, the junction strength cannot be maintained constant in a prescribed heat cycle test, etc.

Japanese Laying-Open No. 63-115,393 (1988) discloses a method of applying a conductive paste mainly composed of tungsten and/or molybdenum and an agent for reinforcing the junction strength made of an oxide mixture of $SiO_2$, $Al_2O_3$ and CaO onto an aluminum nitride sintered body and thereafter firing the same at a temperature of at least 1600° C. However, such a firing temperature is undesirably high and the resultant metallized layer is rather insufficient in its reliability as discussed above regarding Japanese Patent Publication No. 58-11390.

SUMMARY OF THE INVENTION

It is an object of the present invention to provide a method of forming a metallized layer on an aluminum nitride base material, so that a high junction strength between the metallized layer and the aluminum nitride base material is achieved along with a high reliability of the junction, while requiring a lower firing temperature than in the prior art. It is a further object of the invention to provide a metallized layer that achieves the above advantages.

The present method of forming a metallized layer on a surface of an aluminum nitride base material is carried out by:

(a) Mixing together at least an oxide component, an iron family component, and a high melting temperature metal to form a mixture. The oxide component is at least one of $Al_2O_3$, $SiO_2$, CaO, $Y_2O_3$ or a combination thereof. The iron family component is at least one of Fe, Co, Ni or a combination thereof. The high melting temperature metal includes W and Mo. As compared to the content of the oxide component plus the high melting temperature metal, the respective weight percentage: of the oxide component is at least 1 wt. % and not more than 40 wt. %, of the iron family component is at least 0.01 wt. % and not more than 1.0 wt. %, and of the high melting temperature metal is at least 60 wt. % and not more than 99 wt. %. The weight ratio of W to Mo in the high melting temperature metal is at least 1:1 and not more than 1000:1 and preferably at least 2.5:1 and not more than 200:1.

(b) Preparing a high melting temperature paste by mixing an organic binder substance together with the mixture prepared in step (a).

(c) Applying the high melting temperature paste onto a surface of the base material.

(d) Heating the high melting temperature paste applied on the base material at a temperature of at least 1400° C. and less than 1600° C. for a sintered aluminum nitride base material or at least 1600° C. and less than 2000° C. for a non-sintered compact aluminum nitride base material to form the metallized layer on the surface.

The metallized layer according to the invention contains components in proportions within the above specified ranges.

According to the present method of forming a metallized layer, the paste having the above described composition is applied onto a surface of the aluminum nitride sintered body by screen printing or the like, and then fired. Alternatively, such a paste may be applied onto a surface of an aluminum nitride compact such as a pressed body or a sheet compact, and thereafter the aluminum nitride compact is fired to be densified, simultaneously with the firing of the paste.

The paste is mainly composed of the oxide power, the iron family metal powder and the high melting temperature metal powder, plus a binder prior to the heating. The binder contains an organic substance such as ethyl-cellulose resin, nitro-cellulose resin or acrylic resin, and a solvent for the resin. The oxide powder is an important element in the present method of forming the metallized layer. If the content of the oxide component as compared to the total of the oxide component plus the high melting temperature metal is less than 1 percent by weight, the as-formed metallized layer has merely a small adhesion strength with respect to the aluminum nitride sintered body. If the amount of the oxide component contained in the metal paste exceeds 40 percent by weight, on the other hand, adhesion strength of the metallized layer with respect to the aluminum nitride sintered body is also reduced from optimum levels.

The paste contains at least 0.01 percent by weight and not more than 1.0 percent by weight of an iron family metal, i.e. Fe, Ni or Co, as compared to the total of the oxide component plus the high melting temperature metal. The iron family metal facilitates the sintering of the high melting temperature metal also contained in the paste to achieve an increased adhesion or peel strength at a reduced firing temperature. If the amount 1 of the iron family metal contained in the paste is less than 0.01 percent by weight, it is not possible to attain the aforementioned object, namely to reduce the firing temperature and simultaneously achieve a high junction or peel strength. If the amount of the iron family metal contained in the paste exceeds 1.0 percent by weight, on the other hand, the adhesive strength between the aluminum nitride body and the metallized layer is reduced.

The high melting temperature metal powder contained in the paste is made of a mixture of tungsten powder and molybdenum powder. The weight ratio of the tungsten powder to the molybdenum powder is at least 1:1 and not more than 1000:1 and more beneficially, at least 5:1 and not more than 100:1. If the weight ratio of the tungsten powder to the molybdenum powder is less than 1:1, the adhesive strength between the metallized layer and the aluminum nitride body is reduced. If the weight ratio of the tungsten powder to the molybdenum powder exceeds 1000:1, on the other hand, the tungsten powder is insufficiently sintered.

When the weight ratio of the tungsten powder to the molybdenum powder is in the aforementioned range of at least 1:1 and not more than 1000:1, it is possible to attain adhesive peel strengths of at least 5 kg/mm$^2$. When the aforementioned weight ratio is within a range of at least 5:1 and not more than 100:1, it is possible to attain adhesive peel strengths of at least 7 kg/mm$^2$.

The components forming the paste are sufficiently kneaded together in a ball mill, a triple-roll mill, or the like to form a substantially uniform and homogenous paste. The asformed paste is applied by screen printing, brushing, or the like onto a surface of an aluminum nitride sintered body or an aluminum nitride compact formed as a pressed body or a sheet compact. The aluminum nitride sintered body thus coated with the paste is then dried and heated, preferably in a non-oxidizing atmosphere, e.g. a hydrogen and/or nitrogen atmosphere preferably including hydrogen, at a temperature of at least 1400° C. and less than 1600° C. However, when the present paste is applied onto a surface of a non-sintered aluminum nitride compact, heating preferably takes place in an atmosphere containing nitrogen at a temperature of at least 1600° C. and not more than 2000° C. If the heating temperature is less than the lower limit in each heating condition, sintering of the metallized layer is insufficient so that the adhesive strength between the metallized layer and the aluminum nitride sintered body or compact is not improved. If the heating temperature exceeds the upper limit in each condition, on the other hand, the adhesive strength between the metallized layer and the aluminum nitride sintered body or compact is reduced. In each case the heating temperature is to be maintained for at least 5 minutes, and not longer than 120 minutes.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS AND OF THE BEST MODE OF THE INVENTION

Example 1

Ethyl-cellulose and butyl-carbitol were added to tungsten powder materials, oxide powder materials and iron family metal powder materials as shown in Table 1, and sufficiently kneaded in a triple-roll mill, to prepare paste materials for respective samples. The paste materials were applied by screen printing respectively, to surfaces of sintered bodies or sheet compacts of aluminum nitride containing 1 percent by weight of $Y_2O_3$. Thereafter the samples were heated in accordance with the firing conditions shown in Table 1. Referring to Table 1, "$N_2$-5$H_2$" indicates that the volume ratio of $N_2$ gas to $H_2$ gas is 95:5. On the other hand, "50$N_2$-50$H_2$" indicates that the volume ratio of $N_2$ gas to $H_2$ gas is 50:50. Nickel-plated layers of 1.0 μm thickness were formed on the surface of each as-formed metallized layer. Lead frames of copper were brazed onto the nickel-plated layers. In the respective samples thus prepared, the lead frames were pulled in a prescribed direction, in order to measure the adhesive or peel strength values between the metallized layers and the aluminum nitride sintered bodies or compacts.

Figure 1:
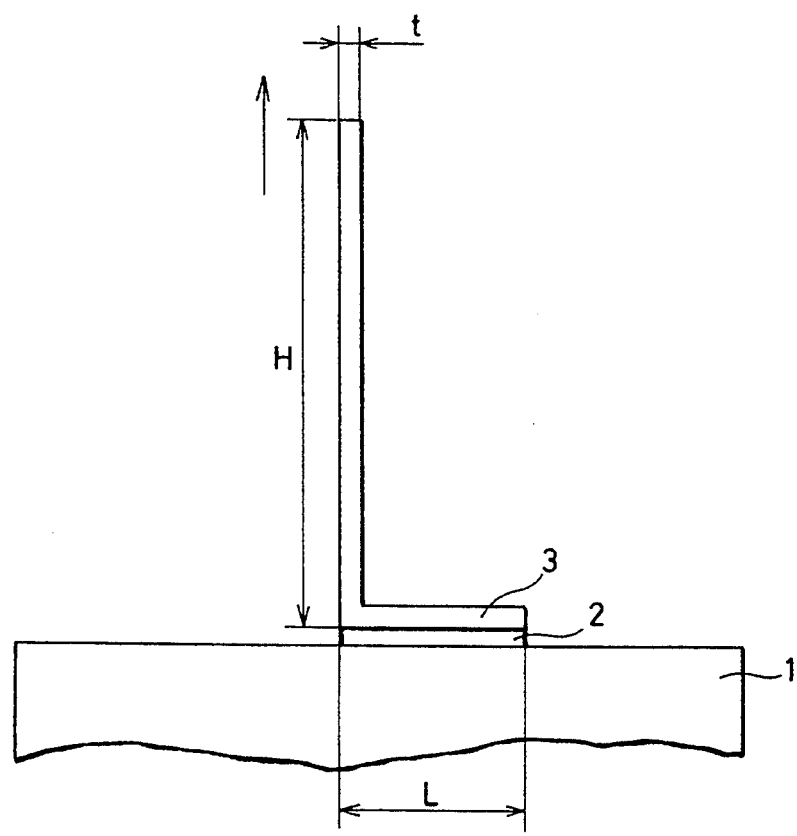
FIG. 1 is a side elevational view showing a method of measuring the peel strength of a lead frame which is joined onto an aluminum nitride sintered carrier by a metallized layer.

FIG. 1 shows a method of measuring the peel strength. A metallized layer is formed on an aluminum nitride sintered carrier 1. A copper member or lead frame 3 is joined onto the metallized layer by a brazing layer 2. Referring to FIG. 1, symbol L denotes a length of 2 mm, symbol H denotes a height of 15 mm, and symbol t denotes a thickness of 0.2 mm. The junction area of the copper member 3 onto the carrier 1 is 2 mm by 2 mm. The copper member 3 is pulled upward in the direction of the arrow P for measuring the load needed for peeling the copper member 3 away from the carrier 1, thereby allowing the peel strength to be calculated in units of kg/mm$^2$.

Table 1 shows the adhesive or peel strength values measured in the aforementioned manner. As understood from Table 1, the metallized layers of the invention formed according to the method of the invention attained extremely high adhesive strength values of at least 5 kg/mm$^2$ with respect to the aluminum nitride sintered bodies or compacts.

relative to the total of the tungsten, molybdenum and oxides. Also, the table does not reflect the paste content of organic binder substance. A sufficient amount of prepared binder including a solvent and an organic component, such as ethyl-cellulose, is added to the tungsten, molybdenum, oxides, and iron family components to form a uniform, homogenous paste having a consistency and viscosity appropriate for the respective technique of coating a paste layer onto the base material. A person having skill in the art will be able to prepare a paste having an appropriate consistency and viscosity. When the paste is heated after it has been applied on the base material, the binder is substantially volatilized, so that essentially no organic material remains in the formed metallized layer. Thus, the compositions given in Table 1 correspond substantially with the final compositions of metallized layers according to the invention formed from the respective samples.

TABLE 1

| Sample | Paste Component (parts by weight) | | | | Print Substrate | Firing Condition | | Adhesive Strength kg/mm$^2$ |
|---|---|---|---|---|---|---|---|---|
| | W | Mo | Oxide | Fe Family | | Temperature | Atmosphere | |
| *1 | 90 | — | Al$_2$O$_3$ 5 CaO 5 | — | Sintered Body | 1650° C. | N$_2$-5H$_2$ | 3 |
| *2 | 80 | 10 | Al$_2$O$_3$ 5 CaO 5 | Fe 0.01 | Sintered Body | 1650° C. | N$_2$-5H$_2$ | 8 |
| 3 | 80 | 10 | Al$_2$O$_3$ 5 CaO 5 | Ni 0.1 | Sintered Body | 1550° C. | N$_2$-5H$_2$ | 10 |
| *4 | 80 | 10 | Al$_2$O$_3$ 5 CaO 5 | Ni 0.1 | Sintered Body | 1350° C. | N$_2$-5H$_2$ | 2 |
| 5 | 80 | 10 | Al$_2$O$_3$ 5 CaO 5 | Ni 0.1 | Sintered Body | 1550° C. | 50N$_2$-50H$_2$ | 7 |
| 6 | 80 | 10 | Al$_2$O$_3$ 5 CaO 5 | Ni 0.1 | Sintered Body | 1550° C. | N$_2$ | 8 |
| 7 | 80 | 10 | Al$_2$O$_3$ 5 CaO 5 | Ni 0.1 | Sheet Compact | 1850° C. | N$_2$ | 7 |
| 8 | 85 | 5 | Al$_2$O$_3$ 5 CaO 5 | Ni 0.1 | Sintered Body | 1550° C. | N$_2$ | 8 |
| 9 | 85 | 5 | CaO 10 | Ni 0.01 | Sheet Compact | 1850° C. | N$_2$ | 8 |
| 10 | 55 | 10 | CaO 5 Al$_2$O$_3$ 15 SiO$_2$ 15 | Ni 0.01 | Sintered Body | 1550° C. | N$_2$ | 6 |
| 11 | 89 | 1 | Al$_2$O$_3$ 5 CaO 5 | Ni 0.1 | Sintered Body | 1550° C. | N$_2$ | 7 |
| 12 | 45 | 45 | Al$_2$O$_3$ 5 CaO 5 | Ni 0.1 | Sintered Body | 1550° C. | N$_2$ | 6 |
| 13 | 84 | 5 | Al$_2$O$_3$ 5 Y$_2$O$_3$ 5 CaO 1 | Ni 0.01 | Sintered Body | 1550° C. | N$_2$ | 8 |
| 14 | 75 | 5 | Al$_2$O$_3$ 10 SiO$_2$ 10 | Ni 0.01 | Sintered Body | 1550° C. | N$_2$ | 7 |
| *15 | 30 | 60 | Al$_2$O$_3$ 5 CaO 5 | Ni 0.1 | Sintered Body | 1550° C. | N$_2$ | 3 |
| *16 | 40 | 10 | Al$_2$O$_3$ 25 CaO 25 | Ni 0.1 | Sintered Body | 1550° C. | N$_2$ | 1 |
| *17 | 90 | 9.4 | Al$_2$O$_3$ 0.3 CaO 0.3 | Ni 0.1 | Sintered Body | 1550° C. | N$_2$ | 2 |
| *18 | 80 | 10 | Al$_2$O$_3$ 5 CaO 5 | Ni 1.5 | Sintered Body | 1550° C. | N$_2$ | 1 |
| 19 | 80 | 10 | Al$_2$O$_3$ 5 CaO 5 | Ni 0.5 | Sintered Body | 1550° C. | N$_2$ | 5 |
| 20 | 80 | 10 | Al$_2$O$_3$ 5 CaO 5 | Ni 0.01 | Sintered Body | 1550° C. | N$_2$ | 7 |
| *21 | 80 | 10 | Al$_2$O$_3$ 5 CaO 5 | — | Sintered Body | 1550° C. | N$_2$ | 3 |
| *22 | 90 | — | Al$_2$O$_3$ 5 CaO 5 | Ni 0.1 | Sintered Body | 1550° C. | N$_2$ | 4 |

(* = Comparative Sample)

Samples shown with asterisk marks (*) are comparative samples not within the literal scope of the claims. For example, sample 1 has no iron family metal and no molybdenum; sample 2 is fired at a slightly too high temperature; sample 4 is fired at a slightly too low temperature; sample 15 has too low a proportion of tungsten relative to molybdenum; sample 16 has too much oxide component and not enough high melting temperature metal; sample 17 has too much high melting temperature metal and not enough oxide component; sample 18 has too much iron family component; sample 21 has no iron family component; and sample 22 has no molybdenum. It should be noted that sample 2 achieved very good peel strength and that it is only excluded from the literal claimed range of heating temperatures because the temperature of 1650° C. is deemed unnecessarily high and similar good results can be obtained at more economical temperatures below 1600° C.

The weight amounts given for the various components of each sample in the table are parts by weight and do not add up to 100 for each sample. Instead, the parts of tungsten, molybdenum and oxides add up to 100 and can be considered to reflect weight percentages of the total of those components. The iron family component is a relatively small additive, and its content in parts by weight can also be considered as a weight percentage Example 2

Paste materials were prepared in a manner similar to that described above in Example 1. Tungsten powder materials were mixed with molybdenum powder materials in various weight ratios, while other paste components were selected in a similar manner to sample No. 11 shown in Table 1, to prepare paste materials for respective samples having different tungsten/molybdenum ratios. The paste materials were applied onto surfaces of aluminum nitride sintered bodies by screen printing. Thereafter the samples were heated in accordance with firing conditions similar to those for the sample No. 11 shown in Table 1.

Figure 2:
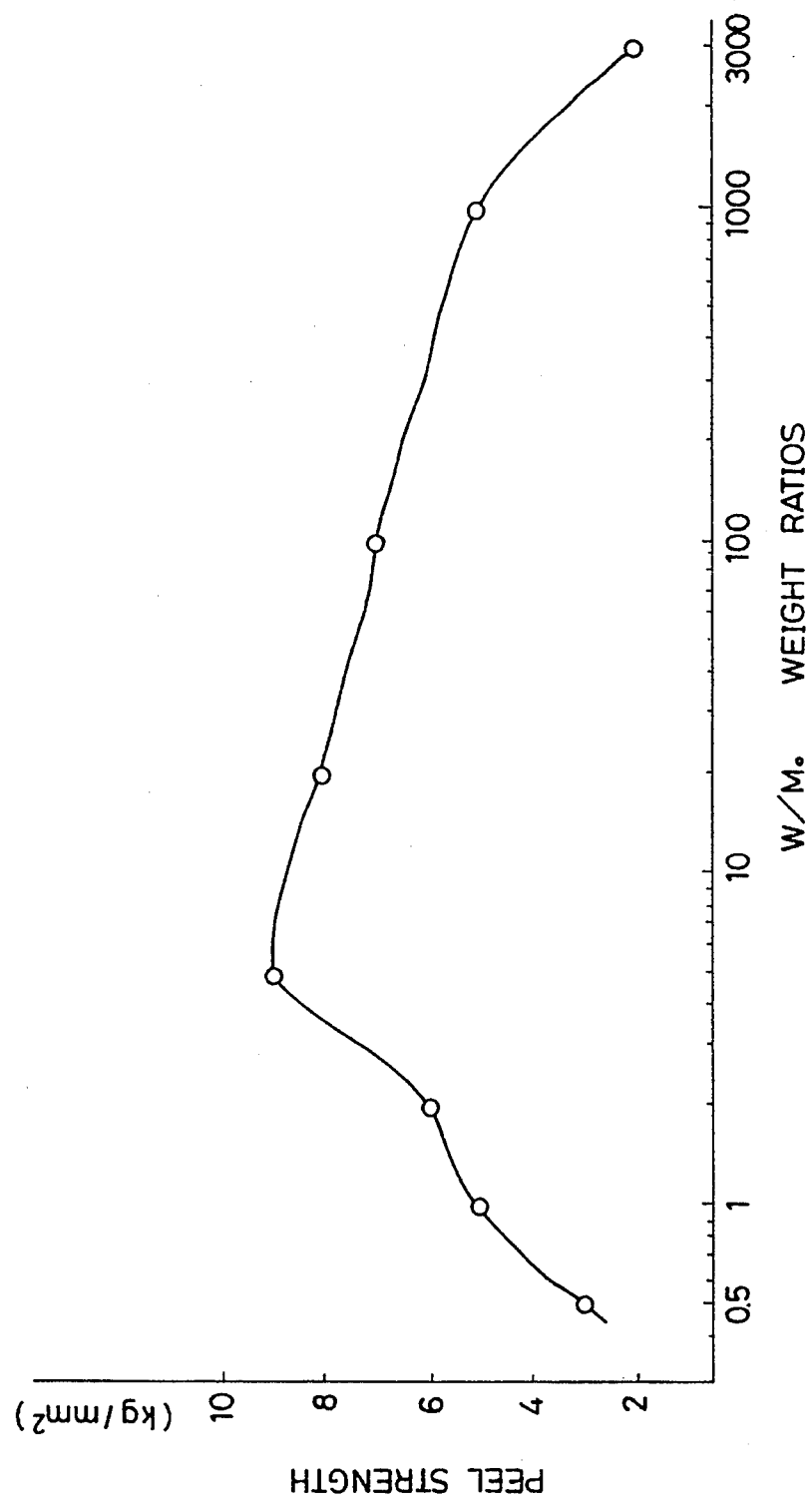
FIG. 2 is a graph showing the peel strength as a function of the weight ratios of tungsten powder to molybdenum powder contained in the paste.

In order to evaluate the as-formed metallized layers, peel strength values were measured in a similar manner to Example 1. FIG. 2 shows the results of the measured peel strength values. As understood from FIG. 2, it is possible to attain a high peel strength of at least about 5 kg/mm$^2$ when the weight ratio of tungsten to molybdenum is within the range of 1:1 to 1000:1. In particular, it is possible to attain high peel strength of at least about 7 kg/mm$^2$ when said weight ratio is in a range of 5:1 to 100:1.

Example 3

By way of comparison to the present invention, paste material was prepared in accordance with the component data shown in embodiment No. 7 of Table 1 of Japanese Patent Laying-Open No. 63-115393 (discussed above). Thus, the paste contained 66.5 percent tungsten, 28.5 percent molybdenum, and 5.0 percent of an oxide mixture including 63 percent $SiO_2$, 15 percent $Al_2O_3$ and 22 percent CaO, mixed and kneaded together with an organic binder and solvent. The paste material was then applied by screen printing onto a surface of an aluminum nitride sintered body. Thereafter, the sample was heated in accordance with the same firing conditions as that for the present sample No. 8 shown in Table 1 above. In order to evaluate the as-formed metallized layer, a peel strength value was measured in the manner described above in present example 1. The measured peel strength was 3 kg/mm$^2$, i.e. lower than those of samples in accordance with the present invention. This is caused by the lack of iron family components, i.e., Fe, Co, or Ni, which are not contained in the paste according to the reference.

Although the invention has been described with reference to specific example embodiments, it will be appreciated that it is intended to cover all modifications and equivalents within the scope of the appended claims.

What we claim is:

1. A method of forming a metallized layer on a surface of a sintered aluminum nitride base material, comprising the following steps:
   (a) mixing together at least an oxide component, an iron family component, and a high melting temperature metal to form a mixture; wherein the oxide component is selected from the group consisting of $Al_2O_3$, $SiO_2$, CaO, $Y_2O_3$ and combinations thereof, the iron family component is selected from the group consisting of Fe, Co, Ni, and combinations thereof and the high melting temperature metal comprises W and Mo; and wherein, as compared to the content of the oxide component plus the high melting temperature metal, the respective weight percentage: of the oxide component is at least 1 wt. % and not more than 40 wt. %, of the iron family component is at least 0.01 wt. % and not more than 1.0 wt. %, and of the high melting temperature metal is at least 60 wt. % and not more than 99 wt. %; and wherein the weight ratio of W to Mo in the high melting temperature metal is at least 2.5:1 and not more than 200:1;
   (b) preparing a high melting temperature paste by mixing an organic binder substance together with the mixture prepared in step (a);
   (c) applying the high melting temperature paste onto a surface of the base material;
   (d) heating the high melting temperature paste applied on the base material at a temperature of at least 1400° C. and less than 1600° C. to form the metallized layer on the surface; and thereby
   (e) achieving an adhesive peel strength of at least 5 kg/mm$^2$ between the metallized layer and the surface.

2. The method of claim 1, further comprising the step of preparing the organic binder substance by mixing at least a solvent and an organic component selected from the group consisting of ethylcellulose resin, nitro-cellulose resin, acrylic resin, and combinations thereof.

3. The method of claim 1, wherein the weight ratio of W to Mo is at least 5:1 and not more than 100:1.

4. The method of claim 1, wherein the heating step is performed in a non-oxidizing atmosphere comprising a gas selected from the group consisting of hydrogen, nitrogen, and mixtures thereof.

5. The method of claim 1, wherein the heating step is carried out for at least 5 minutes and not longer than 120 minutes.

6. A method of forming a metallized layer on a surface of a compacted, non-sintered aluminum nitride base material, comprising the following steps:
   (a) mixing together at least an oxide component, an iron family component, and a high melting temperature metal to form a mixture; wherein the oxide component is selected from the group consisting of $Al_2O_3$, $SiO_2$, CaO, $Y_2O_3$ and combinations thereof, the iron family component is selected from the group consisting of Fe, Co, Ni, and combinations thereof and the high melting temperature metal comprises W and Mo; and wherein, as compared to the content of the oxide component plus the high melting temperature metal, the respective weight percentage: of the oxide component is at least 1 wt. % and not more than 40 wt. %, of the iron family component is at least 0.01 wt. % and not more than 1.0 wt. %, and of the high melting temperature metal is at least 60 wt. % and not more than 99 wt. %; and wherein the weight ratio of W to Mo in the high melting temperature metal is at least 2.5:1 and not more than 200:1;
   (b) preparing a high melting temperature paste by mixing an organic binder substance together with the mixture prepared in step (a);
   (c) applying the high melting temperature paste onto a surface of the base material;
   (d) heating the high melting temperature paste applied on the base material at a temperature of at least 1600° C. and less than 2000° C. to form the metallized layer on the surface; and thereby
   (e) achieving an adhesive peel strength of at least 5 kg/mm$^2$ between the metallized layer and the surface.

7. The method of claim 1, wherein the weight percentage of the oxide component is greater than 15 wt. % and not more than 40 wt. %, the weight ratio of W to Mo in the high melting temperature metal is at least 3:1 and not more than 200:1, and the step of heating the high melting temperature paste is carried out at a temperature of at least 1400° C. and not more than 1550° C.

8. The method of claim 7, wherein the step of heating the high melting temperature paste is carried out at a temperature of at least 1400° C. and less than 1500° C.

9. A method of forming a metallized layer on a surface of a sintered aluminum nitride base material, comprising the following steps:
   (a) sintering aluminum nitride to form the sintered aluminum nitride base material;
   (b) mixing together at least an oxide component, an iron family component, and a high melting temperature metal to form a mixture; wherein the oxide component is selected from the group consisting of $Al_2O_3$, $SiO_2$, CaO, $Y_2O_3$ and combinations thereof, the iron family component is selected form the group consisting of Fe, Co, Ni, and combinations thereof and the high melting temperature metal comprises W and Mo; and wherein, as compared to the content of the oxide component plus the high melting temperature metal, the respective weight percentage: of the oxide component is at least 1 wt. % and not more than 40 wt. % and not more than 1.0 wt. %, and of the high melting temperature metal is at least 60 wt. % and not more than 99 wt. %; and wherein the weight ratio of W to Mo in the high melting temperature metal is at least 2.5:1 and not more than 200:1;

(c) preparing a high melting temperature paste by mixing an organic binder substance together with the mixture prepared in step (a);

(d) applying the high melting temperature paste onto a surface of the base material;

(e) heating the high melting temperature paste applied on the base material at a temperature of at least 1400° C. and less than 1600° C. to form the metallized layer on the surface; and thereby (f) achieving an adhesive peel strength of at least 5 kg/mm$^2$ between the metallized layer and the surface.

10. The method of claim 9, further comprising adding up to about 1 wt. % of $Y_2O_3$ to the aluminum nitride before performing the sintering step.

* * * * *

UNITED STATES PATENT AND TRADEMARK OFFICE
CERTIFICATE OF CORRECTION

PATENT NO. : 5,370,907
DATED : December 6, 1994
INVENTOR(S) : Akira Yamakawa; Nobuo Ogasa It is certified that error appears in the above-indentified patent and that said Letters Patent is hereby corrected as shown below:

On the Title Page, item [54] and column 1, line 4, delete "OF A METAL COMPOSED OF W AND MO".

On the Title Page, item [56], replace "Sasamew" by --Sasame--.

Col. 3, line 40, delete "1".
Col. 4, line 2, replace "asformed" by --as-formed--;
    line 59, after "50:50." insert  a new paragraph spacing.
Claim 9, Col. 9, line 3, after "49 wt.%" insert:
    --, of the iron family component is at least 0.01 wt.%--.

Signed and Sealed this

Twenty-eight Day of February, 1995

Attest:

BRUCE LEHMAN

Attesting Officer

Commissioner of Patents and Trademarks